(12) United States Patent
Singh et al.

(10) Patent No.: US 7,996,797 B1
(45) Date of Patent: Aug. 9, 2011

(54) METHOD AND APPARATUS FOR PERFORMING MULTIPLE STAGE PHYSICAL SYNTHESIS

(75) Inventors: Deshanand Singh, Mississauga (CA); Valavan Manohararajah, Scarbough (CA); Gordon Raymond Chiu, Richmond Hill (CA); Ivan Blunno, Woodbridge (CA); Stephen D. Brown, Toronto (CA)

(73) Assignee: Altera Corporation, San Jose, CA (US)

( * ) Notice: Subject to any disclaimer, the term of this patent is extended or adjusted under 35 U.S.C. 154(b) by 676 days.

(21) Appl. No.: 11/704,497

(22) Filed: Feb. 7, 2007

Related U.S. Application Data

(60) Provisional application No. 60/838,090, filed on Aug. 16, 2006.

(51) Int. Cl.
  *G06F 17/50* (2006.01)
  *G06F 9/45* (2006.01)
  *G06F 9/455* (2006.01)

(52) U.S. Cl. ........ 716/103; 716/116; 716/119; 716/126; 716/132

(58) Field of Classification Search ............... 716/2, 10, 716/17, 18, 103, 116, 119, 126, 132
See application file for complete search history.

(56) References Cited

U.S. PATENT DOCUMENTS

| | | | |
|---|---|---|---|
| 6,360,352 B2 * | 3/2002 | Wallace | 716/2 |
| 6,564,361 B1 * | 5/2003 | Zolotykh et al. | 716/8 |
| 6,697,880 B1 * | 2/2004 | Dougherty | 719/320 |
| 6,754,878 B1 * | 6/2004 | Stentz et al. | 716/7 |
| 6,766,500 B1 * | 7/2004 | Donelly et al. | 716/10 |
| 7,251,804 B1 * | 7/2007 | Trimberger | 716/16 |
| 7,290,240 B1 * | 10/2007 | Lam-Leventis et al. | 716/18 |
| 7,337,100 B1 * | 2/2008 | Hutton et al. | 703/13 |
| 2007/0011643 A1 * | 1/2007 | Wang et al. | 716/18 |
| 2007/0174795 A1 * | 7/2007 | Lavagno et al. | 716/3 |

OTHER PUBLICATIONS

Sawada, H., et al. "Logic Synthesis for Look-up Table Based FPGAs Using Functional Decomposition and Support Minimization", IEEE/ACM International Conference on Computer-Aided Design, Nov. 5-9, 1995, ICCAD-95, pp. 353-358.*

* cited by examiner

*Primary Examiner* — Stacy A Whitmore
*Assistant Examiner* — Magid Y Dimyan
(74) *Attorney, Agent, or Firm* — L. Cho

(57) ABSTRACT

A method for designing a system on a target device includes entering the system. The system is synthesized. The system is mapped. The system is placed on the target device. The system is routed. Physical synthesis is performed on the system immediately after more than one of the entering, synthesizing, mapping, placing and routing procedures.

32 Claims, 10 Drawing Sheets

METHOD AND APPARATUS FOR PERFORMING MULTIPLE STAGE PHYSICAL SYNTHESIS

RELATED APPLICATION

This application claims the priority date of U.S. Provisional Patent Application 60/838,090 filed on Aug. 16, 2006 entitled "A Method and Framework for Multiple Stage Physical Synthesis" under 35 U.S.C. §119(e) which is incorporated herein by reference.

TECHNICAL FIELD

Embodiments of the present invention relate to tools such as electronic design automation (EDA) tools for designing systems on application specific integrated circuits (ASICs) and field programmable gate arrays (FPGAs). More specifically, embodiments of the present invention relates to a method and apparatus for performing multiple stage physical synthesis using EDA tools.

BACKGROUND

ASICs and FPGAs are used to implement large systems that include million of gates and megabits of embedded memory. The complexity of large systems often requires the use of EDA tools to create and optimize a design for the system onto physical target devices. Among the procedures performed by EDA tools in a computer aided design (CAD) flow are synthesis, technology mapping, clustering, placement, and routing.

In the past, physical synthesis was optionally used to perform a series of circuit transformations to optimize the design of the system. Unlike traditional synthesis, physical synthesis may take into account the technology and architecture of the target device and delays associated with signals on the target device while performing the circuit transformations to optimize the design of the system. Physical synthesis would typically be performed at a single point after placement and before routing to improve the delays on connections to be routed. Estimates of interconnect delay obtained from existing placement could be used to guide physical synthesis transformations that restructure the circuit on or near a critical path.

Traditional physical synthesis techniques performed after placement and before routing, however, were not as effective in optimizing other goals in the design of systems. Thus, what is needed is an efficient method and apparatus for applying physical synthesis to other goals in the design of a system on an ASIC or FPGA.

SUMMARY

According to an embodiment of the present invention, physical synthesis is performed at multiple stages of a CAD flow. In this embodiment, physical synthesis may be used to achieve the goal of reducing delay along paths to be routed, reducing an area required for implementing a circuit, reducing the power required for a system, improving routability, and/or other goals. According to an alternate embodiment of the present invention, physical synthesis may be performed at one or more stages in a CAD flow other than or in addition to a stage between placement and routing.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
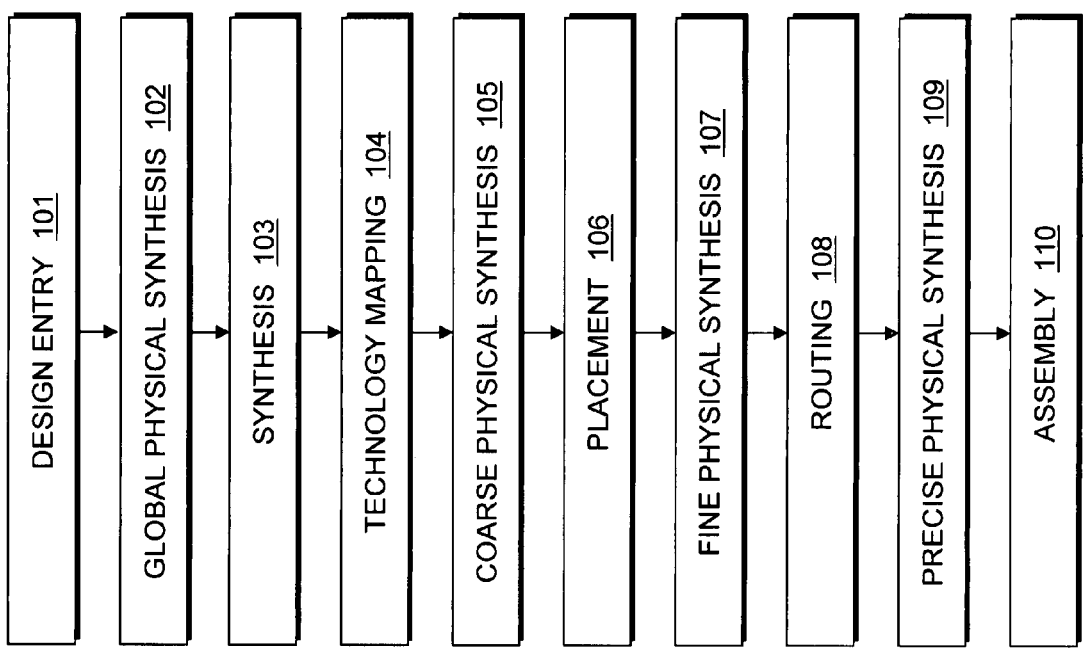
FIG. 1 is a flow chart illustrating a method for designing a system on a target device according to an exemplary embodiment of the present invention.

FIG. 1 is a flow chart illustrating a method for designing a system on a target device according to an embodiment of the present invention. At 101, a design for the system is entered into a design tool. The design may be described at a gate level or in a more abstract level. The design may be described in terms of a hardware description language (HDL) such as VHDL or Verilog. The target device may be an ASIC, structured ASIC, FPGA, programmable logic device (PLD), or other target device.

At 102, global physical synthesis is performed.

At 103, the system is synthesized. Synthesis includes generating a logic design of the system to be implemented. According to an embodiment of the present invention, synthesis generates an optimized logical representation of the system from a HDL design definition. The optimized logical representation of the system may include a representation that has a minimized number of functional blocks and registers, such as logic gates and logic elements, required for the system.

At 104, technology mapping is performed on the optimized logic design. Technology mapping includes determining how to implement logic gates and logic elements in the optimized logic representation with resources (components) available on the target device. According to an embodiment of the present invention, a netlist is generated from mapping. This netlist may be an optimized technology-mapped netlist generated from the HDL.

At 105, coarse physical synthesis is performed.

At 106, the mapped logical system design is placed. Placement works on the optimized technology-mapped netlist to produce a placement for each of the functional blocks. According to an embodiment of the present invention for a target device that is a structured ASIC, placement includes fitting the system on the target device by determining which components on the logic design are to be used for specific logic elements, and other function blocks. Placement may include clustering which involves grouping logic elements together to form the logic clusters present on the target device.

At 107, fine physical synthesis is performed.

At 108, it is determined which routing resources should be used to connect the components in the logic design implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 109, precise physical synthesis is performed.

At 110, an assembly procedure is performed. The assembly procedure involves creating a data file that includes information determined by the procedures described by one or more of 101-109. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the data file or other aspects of the design of the system may also be output in other forms such as on a display device or other medium.

Physical synthesis is illustrated in FIG. 1 at four stages in the design flow (immediately after design entry at 102, immediately after technology mapping at 105, immediately after placement at 107, and immediately after routing at 109). It should be appreciated that not all four of the stages are required to be utilized in designing a system on a target device, that additional stages of physical synthesis may be implemented, that physical synthesis may be implemented at stages other than the stages that are shown, and that physical synthesis may be performed within one or more of the procedures 101, 103, 104, 106 and/or 108. For example, according to an embodiment of the present invention, physical synthesis may be performed within the placement procedure 106 between placement and clustering. According to an embodiment of the present invention, physical synthesis includes a series of circuit transformations to optimize the circuit for a given goal. The circuit transformations occur outside the stage of design entry, synthesis, technology mapping, placement, and routing. Physical synthesis may be used to optimize a circuit for goals such as reducing a delay of a signal transmitted on a circuit, reduction of an area required for implementing the circuit on a target device, reducing the amount of power required for operating the circuit or the system, improving the routability of the circuit, and/or other goals.

Physical synthesis may be used to perform a series of circuit transformations to optimize a circuit in a system such that a delay of a signal in the system is reduced. Most of the delays in an FPGA circuit are due to the programmable routing network. These delays cannot be determined with great certainty until routing is completed. The traditional logic synthesis procedure at 103 is responsible for creating a circuit implementation that will realize the functionality of a designer's hardware specification. At this early stage of the design flow it is difficult to predict the delays of routed connections. It is for this reason that traditional logic synthesis may create circuit structures that are sub-optimal in terms of critical path performance. By performing physical synthesis at later stages of the design flow, better estimations of routed delays may be predicted and used to perform optimizations to reduce the delays.

Physical synthesis may be used to perform a series of circuit transformations to optimize a circuit in a system such that the area required on the target device for the circuit is reduced. The amount of area required to implement a circuit on an FPGA is known after technology mapping, when the circuit is mapped from a generic technology independent gate-level netlist representation to specific combinatorial and registered elements. Prior to the technology mapping procedure 104 of the design flow, it is difficult to predict the final area requirement of the circuit. It is for this reason that traditional logic synthesis may choose, in the interest of other cost metrics such as performance, an implementation for a circuit that is sub-optimal in terms of area. By performing physical synthesis after technology mapping 104, information regarding the area required to implement the circuit is available. Several techniques of optimizing the circuit structure to improve area may be employed during physical synthesis including mapping over-used resources (such as combinational lookup tables) to unused resources (such as memories).

Physical synthesis may be used to perform a series of circuit transformation to optimize a circuit in a system such that the power required to operate the system is improved. For example, physical synthesis may reduce the wirelength and thus capacitance of signals with a high toggle rate. Physical synthesis may also use programmable inverters to bias the distribution of high and low signals when one signals utilizes less power than others. Performing physical synthesis after the technology mapping procedure 104 of the design flow is well suited to reduce the amount of dynamic power consumed by the system. Signals with a high toggle rate can be identified and moved forward through the cone of logic so that fewer levels of logic toggle. Performing physical synthesis after routing can further reduce power consumption by identifying routing connections which glitch and insert registered logic to filter these glitches.

Physical synthesis may be used to perform a series of circuit transformation to optimize a circuit in a system to improve the routability of the system. For most circuits, the final routing connections chosen are very close to the optimal, shortest connections available for the given placement. A subset of designs are considered difficult to route, for which it may not be possible to find a legal route, or find a routing that preserves the performance of the circuit. Optimizing for routability may entail reducing the total wirelength usage of the circuit and reducing the contention for highly used and often congested wired segments. Physical synthesis performed prior to placement benefit from having high flexibility. Physical synthesis performed after placement benefit from having access to accurate prediction of wirelength is available and estimates can be made of probable congestion.

According to an embodiment of the present invention, the physical synthesis stages 102, 105, 107, and 109 shown in FIG. 1 may change their behavior according to the results and stages of previous stages in the design flow. According to one aspect of this embodiment, state information is passed between each stage of physical synthesis. This allows each stage of physical synthesis to adapt and changes its behavior in response to the quality of estimations and the actions performed by a previous physical synthesis stage. For example, when a later physical synthesis stage discovers that a previous stage performed optimizations using an inaccurate prediction, additional optimizations in the current physical synthesis stage may be performed. The additional optimizations may be performed with more accurate predictions that improve the circuit. On the other hand, when an earlier physical synthesis stage is determined to have made an accurate prediction and a subsequent physical synthesis stage recognizes that any optimizations it performs will be using the same prediction, it may determine not to perform an unnecessary optimization to reduce compile time. It should be appreciated that state information from a stage of physical synthesis may be left to any other stage of physical synthesis to be used in a subsequent iteration of the design flow.

Figure 2:
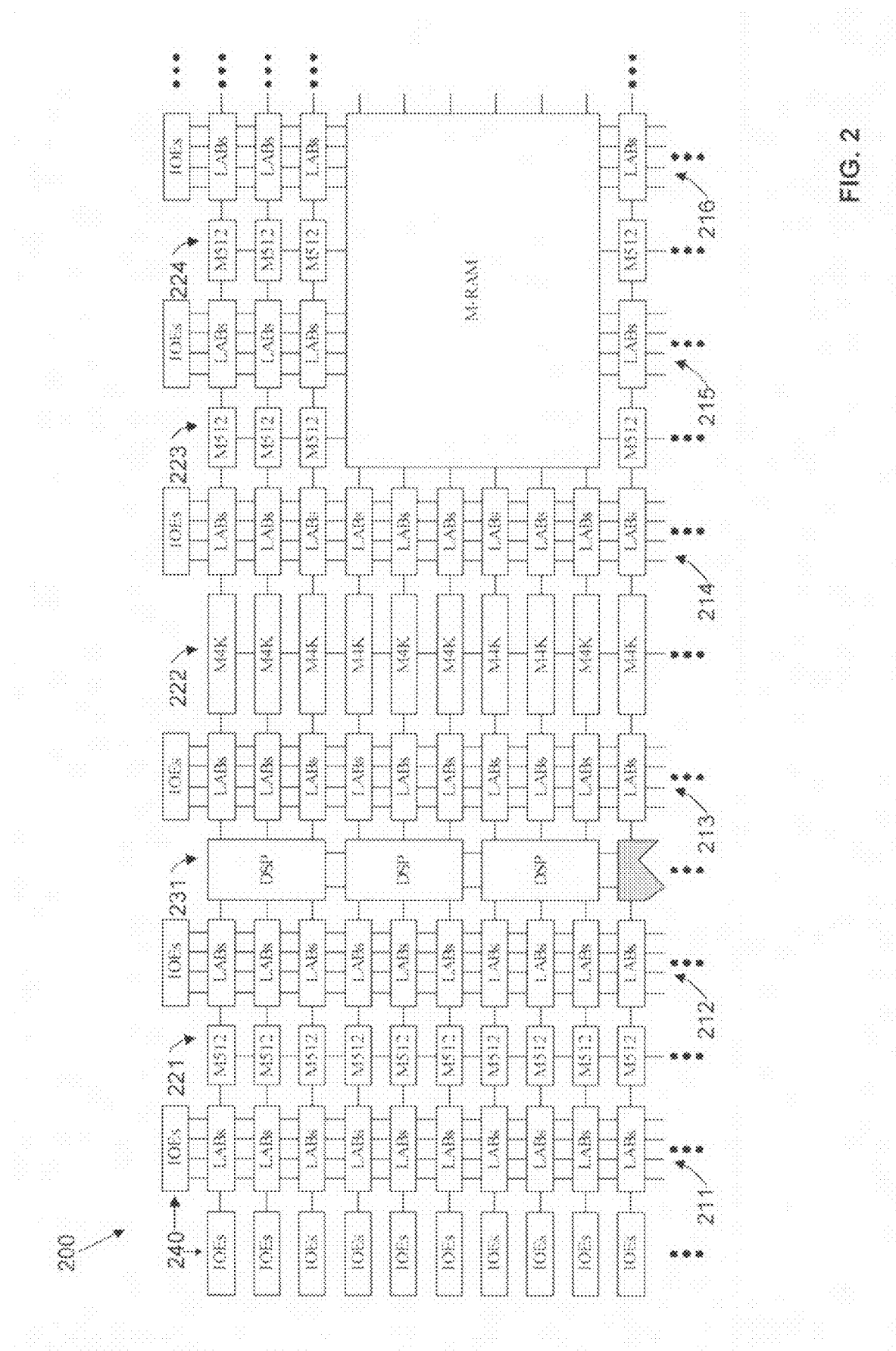
FIG. 2 illustrates an exemplary target device according to an exemplary embodiment of the present invention.

FIG. 2 illustrates an exemplary target device 200 in which a system may be implemented on 200 utilizing an FPGA according to an embodiment of the present invention. According to one embodiment, the target device 200 is a chip having a hierarchical structure that may take advantage of wiring locality properties of circuits formed therein.

The target device 200 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. LUT chain connections transfer the output of one logic block LUT to the adjacent logic block for fast sequential LUT connections within the same LAB. Register chain connection lines transfer the output of one logic block register to the adjacent logic block's register within a LAB. According to an alternate embodiment of the present invention, the logic block may operate similarly to an adaptive logic module (ALM), such as those found in Stratix™ manufactured by Altera® Corporation. In this embodiment, the logic block may include 2 registers, 2 sets of addition circuitry, a combinational logic module that may be configured to implement two single six input LUT, or two LUTs with five or fewer inputs. LABs are grouped into rows and columns across the target device 200. Columns of LABs are shown as 211-216. It should be appreciated that the logic block may include additional or alternate components.

According to an embodiment of the present invention, additional registers are available for implementing logic functions with the logic blocks in the target device. The additional registers may be associated with a LAB or a subset of logic blocks within a LAB. The registers may be independent registers that are not associated with a specific logic block. Alternatively, the registers may be integrated inside logic blocks.

The target device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200. Columns of memory blocks are shown as 221-224.

The target device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 200 and are shown as 231.

The target device 200 includes a plurality of input/output elements (IOEs) 240. Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections.

The target device 200 also includes a plurality of row interconnect lines ("H-type wires") (not shown) that span fixed distances. Dedicated row interconnect lines, route signals to and from LABs, DSP blocks, and memory blocks within the same row. The row interconnect lines may span a distance of up to four, eight, and twenty-four LABs respectively, and are used for fast row connections in a four-LAB, eight-LAB, and twenty-four-LAB region. The row interconnects may drive and be driven by LABs, DSP blocks, RAM blocks, and horizontal IOEs.

The target device 200 also includes a plurality of column interconnect lines ("V-type wires") (not shown) that operate similarly to the row interconnect lines. The column interconnect lines vertically routes signals to and from LABs, memory blocks, DSP blocks, and IOEs. Each column of LABs is served by a dedicated column interconnect, which vertically routes signals to and from LABs, memory blocks, DSP blocks, and IOEs. The column interconnect lines may traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, Stratix™, Cyclone™, Stratix™ II, and Cyclone™ II families of chips and those employed by Xilinx® Inc. in its Virtex™ and Virtex™ II, and Virtex IV™ line of chips.

Figure 3:
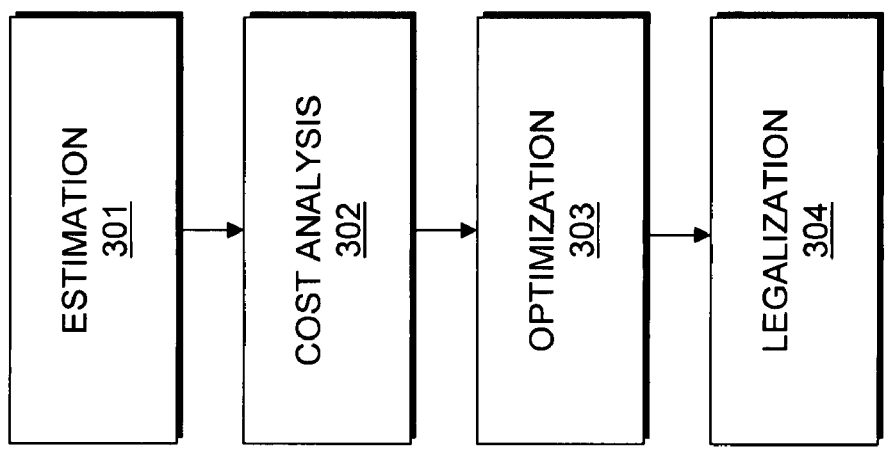
FIG. 3 is a flow chart illustrating a method for performing physical synthesis according to an exemplary embodiment of the present invention.

FIG. 3 is a flow chart illustrating a method for performing physical synthesis according to an exemplary embodiment of the present invention. The method for performing physical synthesis as shown in FIG. 3 may be implemented at 102, 105, 107, and/or 109 as shown in FIG. 1. At 301, estimation is performed to predict and estimate characteristics of a circuit. The characteristics may include delay, area, power, and/or wirelength. When accurate characterization is available, the estimator may read information from a pre-existing model, stage, or structure.

To generate an estimation of delay, a delay modeling and timing analysis is performed. Delay modeling estimates the delays for specific connections in a netlist. The delay model may be as accurate as an exact routing delay estimation, if routes are available, or may require an extensive prediction from an existing netlist structure. After the delays are estimated, a static timing analysis is performed on the netlist. Static timing analysis may analyze each path in the circuit and verify if the path is able to meet all of its timing constraints. Static timing analysis generates a slack of the path which describes how far a path is from meeting its constraint. Slack may be described with the following relationship.

SLACK(path)=TIMING CONSTRAINT(path)−DELAY(path)

To generate an estimation of an area required to implement the circuit, an area count is performed after technology mapping. The area count counts the number of combinational nodes required to implement the circuit. Prior to technology mapping, the area estimator performs area modeling to help predict the final area of the circuit. The area modeling may utilize a constant area model, entropy, average cube complexity, or other techniques to estimate the area of the circuit. It should be appreciated that other techniques may also be used to generate an estimation of delay, area, power, and routability.

To generate an estimation of power consumed by the circuit, vectorless estimation techniques or test vectors input at the design entry stage of the design flow may be used. Estimation of the amount of power consumed by the circuit may include the amount of power consumed by the design as a whole as well as by individual wires. Transition densities for connections and paths may also be computed in the estimation of power.

To generate an estimation of routability, the same delay modeling used in delay estimation may be used to estimate the length of a specific path or connection. By running a router, the routing congestion of a design can also be estimated.

At 302, cost analysis is performed. According to an embodiment of the present invention, a cost function is used for the cost analysis that is a mapping function G( ) for each path in the circuit that takes the circuit characteristics predicted by the estimations performed at 301 and transforms these estimated values into a normalized criticality value that ranges from [0,1], according to constraints and priorities specified by the designer.

G(slack, area, power, routability)--≦[0,1]

Connections that are important are given a criticality value near 1, while connections are non-important are given a criticality value near 0. For example, when solely considering a timing constraint optimization goal, connections that have the lowest slack values (those furthest from meeting their constraints) are given a criticality value of 1, where those with the highest slack values are given a criticality value of 0.

In addition to a cost per-path in the circuit, the cost function may also calculate a global cost of the entire circuit (figure of merit). The global cost of a circuit may be used to compare different versions of a circuit to determine which provides a better result.

At 303, optimization is performed on the netlist. The goal of the optimization may include reducing delay, reducing area, reducing power consumption, improving routability, and/or other goals. According to an embodiment of the present invention, the criticality values noted by the cost function indicate which paths in the netlist are to be optimized. Reducing delay, reducing power consumption, and improving routability share a similar goal in optimization of reducing the length of critical paths. A critical path is a path that is far from meeting timing constraints, has a high toggle rate, or contents for congested routes. Techniques used for reducing the length of a critical path include incremental retiming, combinational or binary decision diagram (BDD)-based resynthesis, logic replication, and local rewiring. For reducing the area required for a circuit, the area of non-critical connections (connections have 0 or near 0 criticality values) may be reduced. Techniques used for reducing the area of the non-critical connections may include combinational resynthesis to find more area optimal representations for a cone of combinational logic. Alternatively, the combinational and sequential logic may be mapped into unused resources such as memories. It should be appreciated that other techniques may also be used to optimize the design of the system.

Figure 4A:
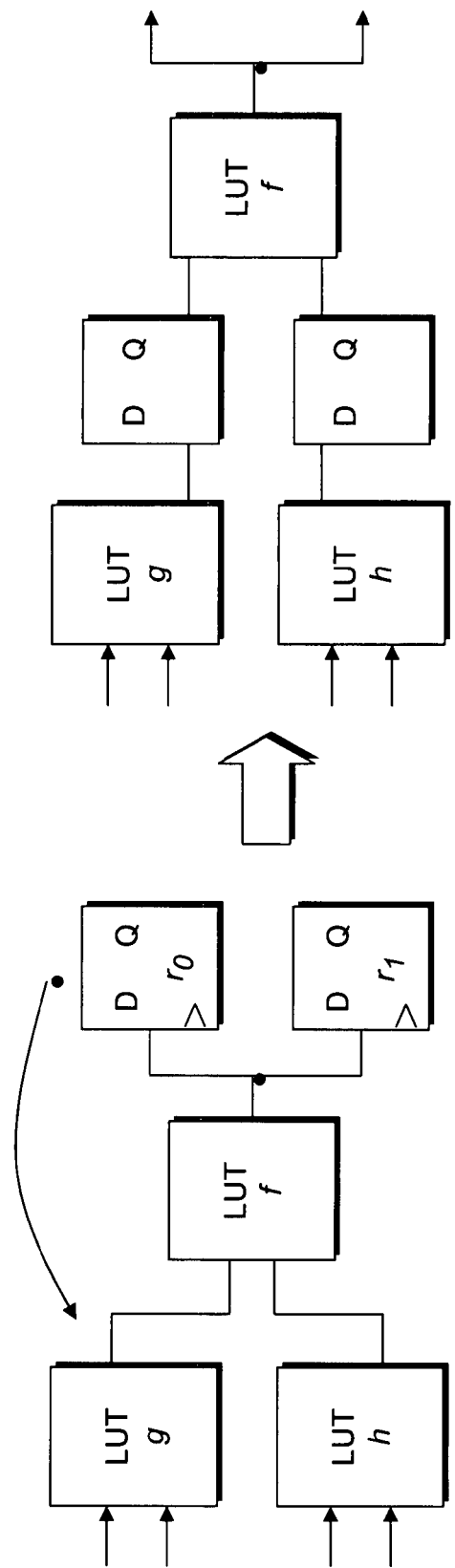
FIGS. 4a and 4b illustrate examples of backward and forward retiming pushes according to an exemplary embodiment of the present invention.
Figure 4B:
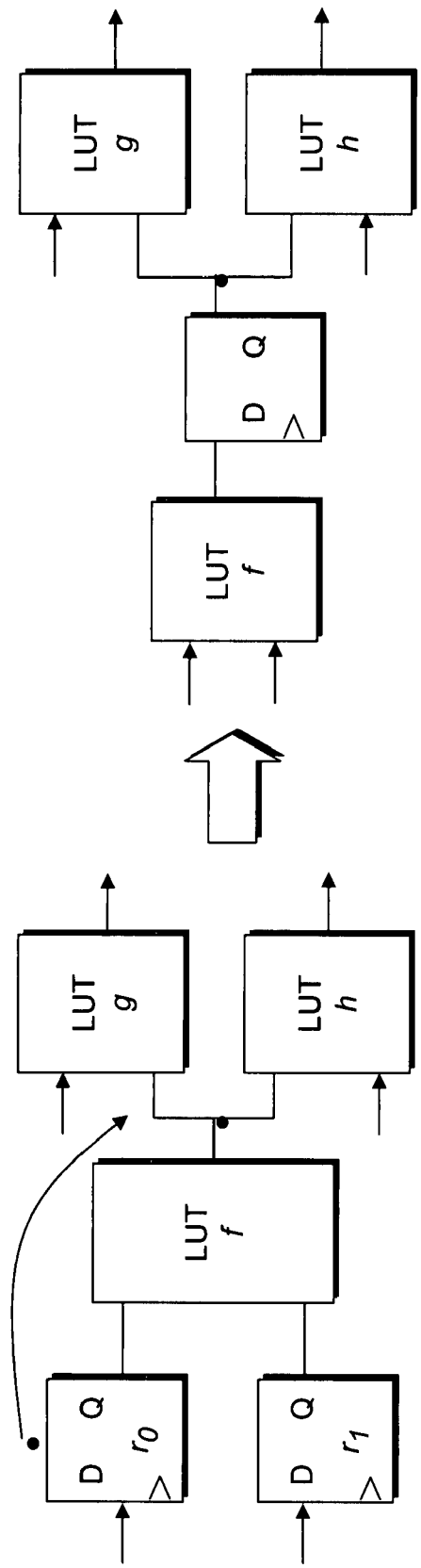

According to an embodiment of the present invention, incremental retiming involves performing a series of backward and forward retiming iterations. During a backward retiming iteration, registers with inputs that come from a critical or near critical path are identified. These registers are pushed backwards across the logic driving it as illustrated in FIG. 4a. During a forward retiming iteration, registers with outputs that are connected to a critical or near critical path are identified. These registers are pushed forward across the logic being driven as illustrated in FIG. 4b. During both backward and forward pushes, the functionality of the circuit remains unchanged during power-up and reset conditions. According to an embodiment of the present invention, registers are set to zero on power-up. Reset signals also set the registers to zero. The functionalities of LUTs f, g, and h are changed to preserve the power-up and reset functionality expected of the sub-circuits illustrated.

According to an embodiment of the present invention, BDD-based resynthesis involves using a procedure to find alternative functional decompositions for critical or near critical logic in a circuit. Given a function f(X,Y) defined over two sets of variables X and Y, functional decompositions finds subfunctions g1(Y), g2(Y), . . . , gk(Y) such that f can be re-expressed in terms of f(X, g1(Y), g2(Y), . . . , gk(Y)). The set of variables X is referred to as the free set and the set of variables Y is referred to as the bound set. If there are no variables common to X and Y, the decomposition is said to be disjoint. Otherwise, the decomposition is said to be non-joint.

Figure 5:
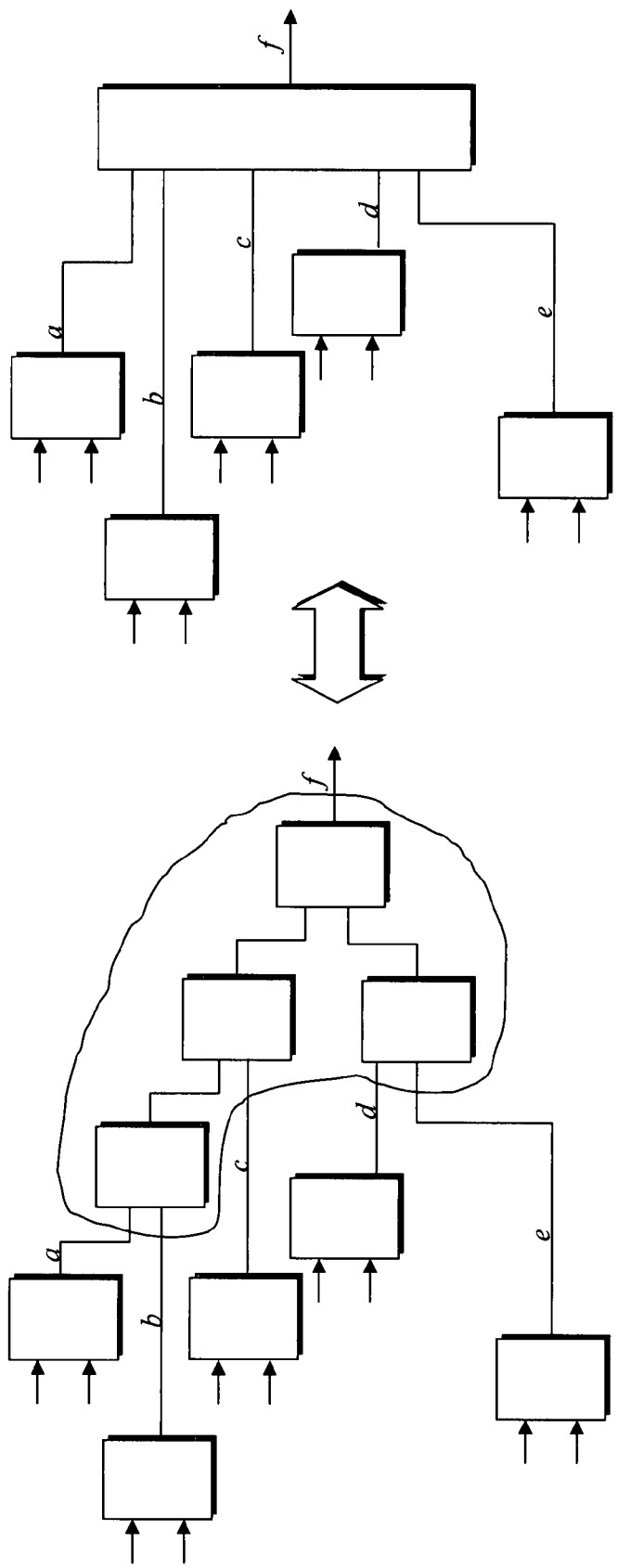
FIG. 5 illustrates an example of a BDD-based resynthesis operation according to an exemplary embodiment of the present invention.

The LUTs in an FPGA are capable of implementing any function of k variables. Functional decomposition can be used to find sub-functions that fit naturally into LUTs. FIG. 5 illustrates an example of resynthesis. First, a LUT with critical inputs is identified. Next, a cone of logic rooted at f is grown. The cone is then collapsed into a single LUT and a BDD representing the functionality of the cone constructed. Functional decomposition is performed directly on the BDD. At each step of the decomposition, a single LUT suitable for the target architecture is extracted from the BDD and BDD is re-expressed in terms of the extracted LUT. This procedure is continued until the remaining BDD fits into a single LUT.

Figure 6:
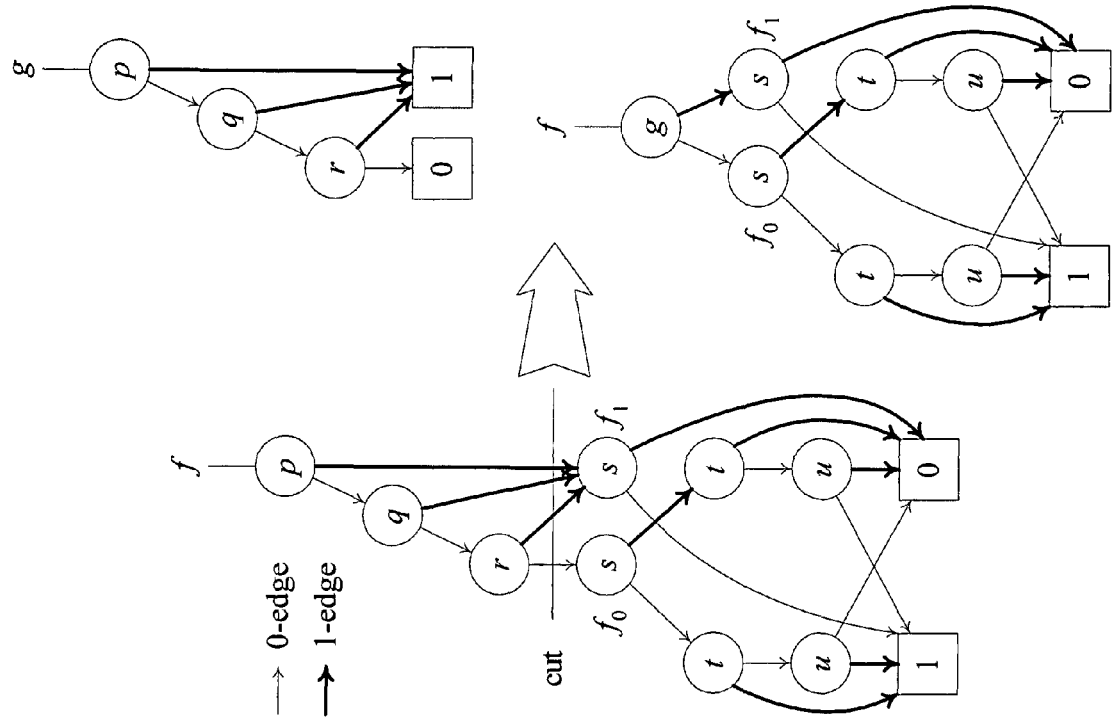
FIG. 6 illustrates an example of BDD-based decomposition according to an exemplary embodiment of the present invention.

FIG. 6 illustrates an example of BDD-based functional decomposition. FIG. 6 illustrates a reduced, ordered BDD for the function $f=(p+q+r)\bar{s}+\overline{(p+q+r)}(\bar{s}t+\bar{s}u+\overline{stu})$. An alphabetical ordering of the variables for the BDD off is used. During resynthesis, a sifting procedure moves non-critical variables to the top of the BDD. A cut in the BDD establishes two sets of variables. The variables above the cut constitute a bound set and the variables below the cut constitute a free set. FIG. 6 illustrates a cut in f that separates the bound set, {p, q, r}, from the free set {s, t, u}. The portion of the BDD above the cut references two distinct functions, $f_0$ and $f_1$, below the cut. Thus, the portion of the BDD above the cut can be replaced by a single Boolean variable g that determines whether $f_0$ or $f_1$ is to be selected. A separate BDD computes the value for g, and in the new BDD for $f$, $f_0$ is selected when g=0 and $f_1$ is selected when g=1. The resulting decomposition can be expressed as $g=p+q+r$ and $f=\bar{g}\bar{s}+\bar{g}(\bar{s}t+\bar{s}u+\bar{s}tu)$.

Figure 7:
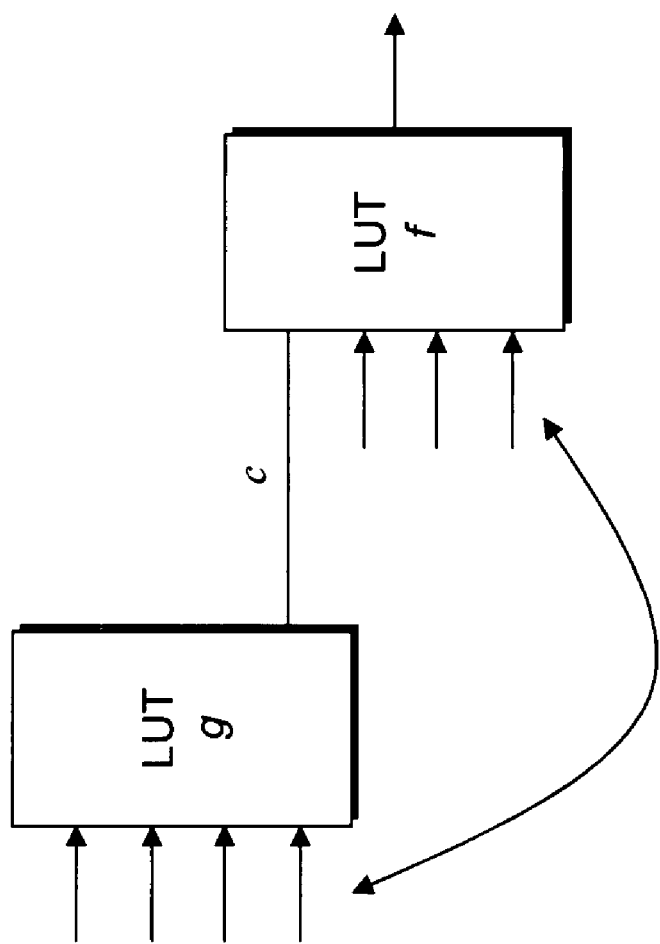
FIG. 7 illustrates an example of local rewiring according to an exemplary embodiment of the present invention.

FIG. 7 illustrates an example of local rewiring optimization according to an embodiment of the present invention. In this example, a pair of LUTs, f and g, are identified that are connected by a critical signal c. Using functional decomposition techniques, it is determined whether the overall timing of the two LUTs can be improved by swapping some of the non-critical signals attached to f with some of the critical signals attached to g. Although local rewiring and BDD-based resynthesis use functional decomposition techniques, they operate on two different scales. Local rewiring considers two LUTs at a time while BDD-based resynthesis considers entire cones at a time. The result is that the operations carried out during local retiming have much more predictable timing changes and introduce very little illegality into an existing circuit.

Figure 8:
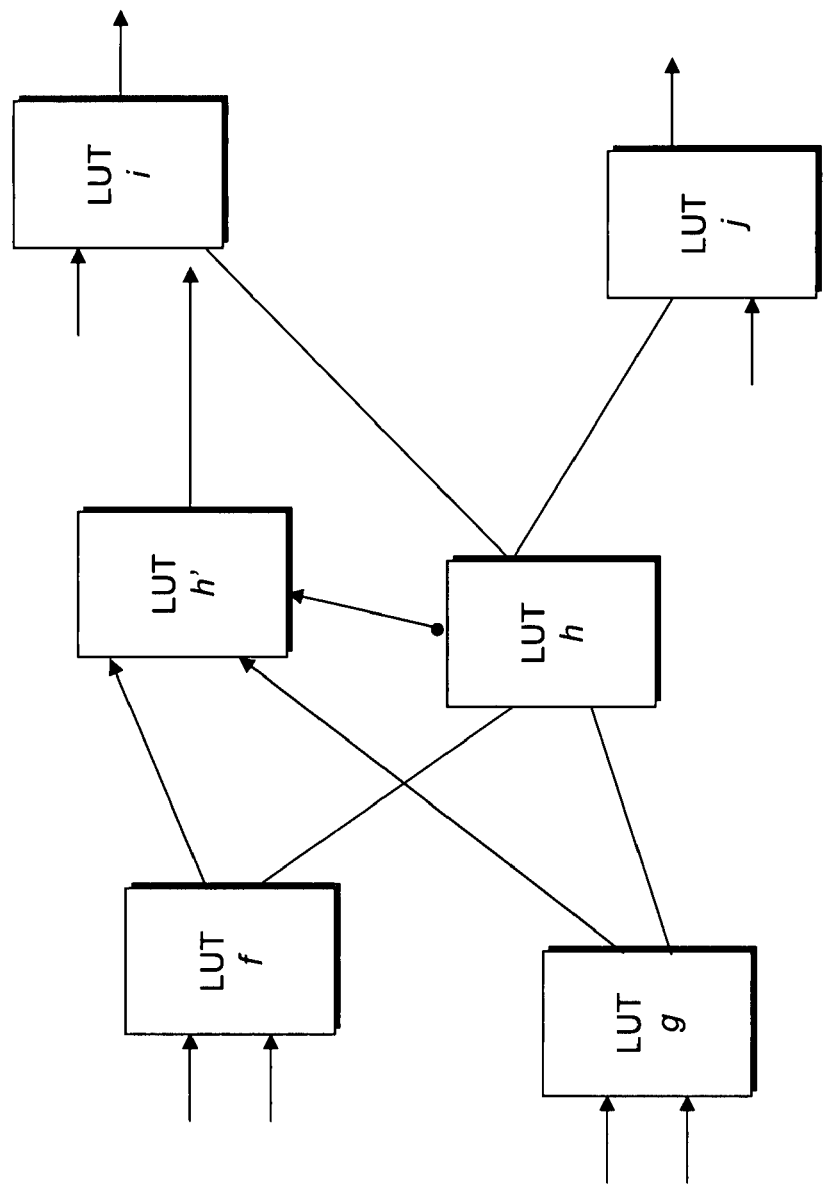
FIG. 8 illustrates an example of logic replication according to an exemplary embodiment of the present invention.

According to an embodiment of the present invention, logic replication is utilized to generate a duplicate of a component. The duplicate is used to reduce the length of a critical path associated with the component without significantly affecting the length of other paths in the system. Logic replication includes making an identical copy of a component, which may include a combination of a LUT and a register, on a critical or near-critical path. The duplicate is placed in a determined location that improves the overall slack of the system. FIG. 8 illustrates an example of logic replication according to an exemplary embodiment of the present invention. Following a placement procedure in the design flow, a LUT that drives a signal with several fanouts may be placed at a location that is not ideally suited for any of its fanouts. In FIG. 8, LUT h drives two LUTs, i and j, and LUT h has been placed at a location that balances its need to drive both LUTs at the same time. However, if connection c is critical, LUT h can be replicated to produce a new LUT h'which can be placed closer to the target of c. Logic replication may perform this transformation on critical signals driven by multi-fanout sources.

Referring back to FIG. 3, at 304 legalization is performed on the system. Physical synthesis optimizations performed at 303 may transform a circuit such that placement or routing becomes invalid. Various procedures may be used to legalize the system depending on the optimization performed at 303. After performing optimizations in a post-technology mapping physical synthesis stage, it may be necessary to legalize the LUTs. This may be achieved by utilizing rotation, decomposition, and inversion to re-implement each LUT into legal LUTs. After performing optimizations in a post-placement stage, it may be necessary to legalize wires that have been created and place new LUTs created. This may be achieved by performing incremental placement to integrate the modifications made by timing driven optimizations into existing placement while perturbing the existing placement as little as possible. After performing optimization in a post-routing stage, it may be necessary to legalize the routing changes made. This may be achieved by performing incremental re- routing to determine valid routes for the modified circuit. It should be appreciated that other techniques may also be used to perform legalization on the system.

Timing driven optimizations that take place during fine physical synthesis 107 (shown in FIG. 1) may create an invalid placement. For example, a BDD-based resynthesis procedure may create new wires that violate the constraint on the number of wires entering a LAB. A logic replication algorithm may create new LEs which would require placement. Incremental placement may be used to integrate the modifications made by the timing driven optimizations into the existing placement. The primary goal of incremental placement is to resolve architectural violations crated when the circuit modifications are integrated into existing placement. Nearly all architectural constraints in modern FPGAs are found in the clustered logic blocks, such as LABs. Some common constraints include a limit on the number of LEs in a cluster, the number of inputs to a cluster, the number control signals that can be used within a cluster. Incremental placement uses an iterative improvement strategy where logic elements are moved according to a cost function. This cost function includes three components cluster legality cost, timing cost, and wirelength cost. Cluster legality costs relate to the penalty imposed on a cluster if it includes any architectural violations. The cost may be proportional to the total number of constraints violated. Timing costs may be used to ensure that critical logic elements are not moved into locations that would significantly increase the critical path delay. Wirelength cost may be used to endure that a circuit is easily routable after the logic element moves. The total cost is a weighted sum of these costs. Cost lowering moves may be made in incremental placement until no further illegalities exist in placement.

FIGS. 1 and 3 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Figure 9:
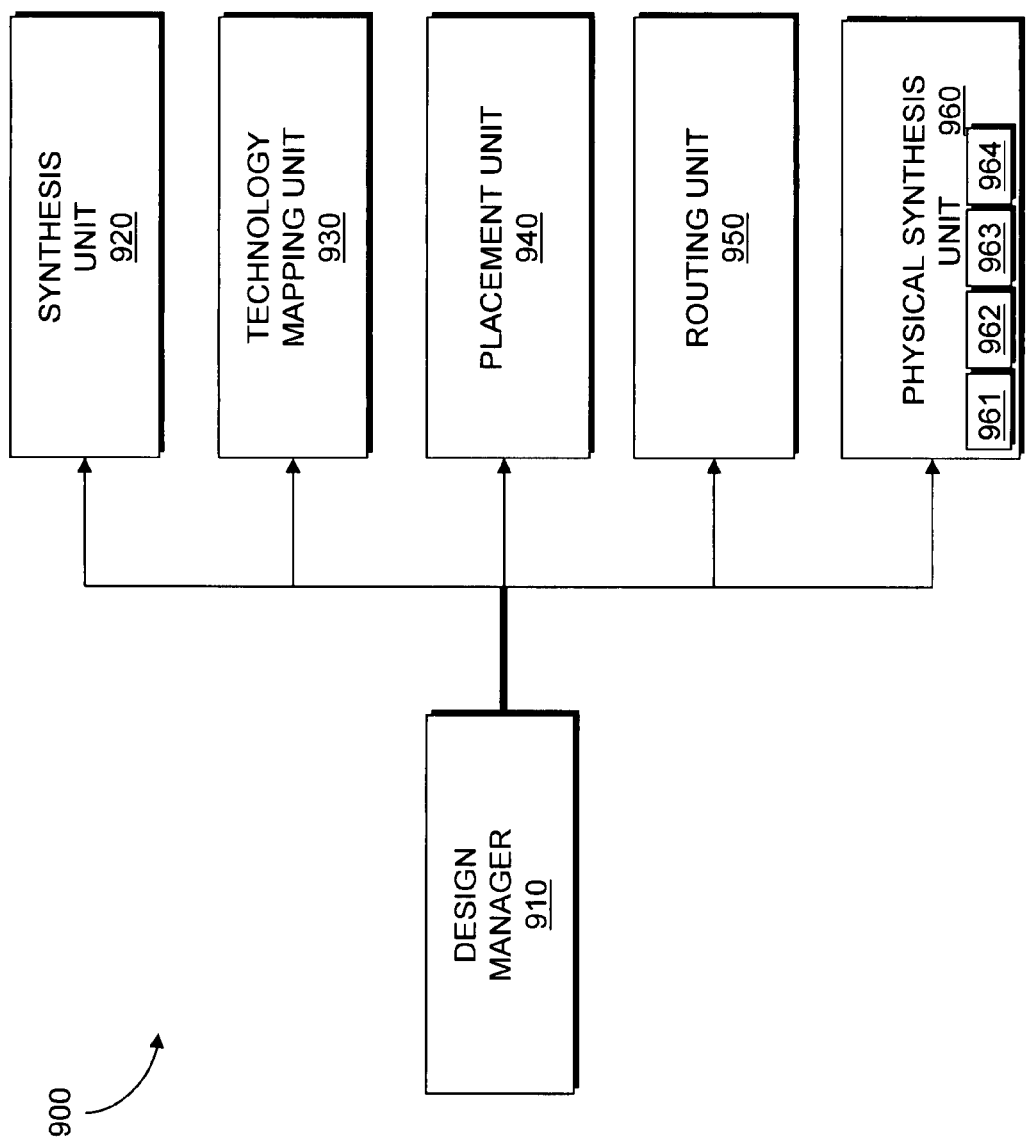
FIG. 9 illustrates a system designer according to an exemplary embodiment of the present invention.

FIG. 9 illustrates a system designer 900 according to an embodiment of the present invention. The system designer 900 may be an EDA tool for designing a system on a target device. The target device may be, for example, an ASIC, a structured ASIC, an FPGA, a PLD, or other circuitry. Furthermore the logic design may be implemented using semiconductor or nanoelectronic technology. FIG. 9 illustrates software modules implementing an embodiment of the present invention. According to one embodiment, system design may be performed by a computer system (not shown) executing sequences of instructions represented by the software modules shown in FIG. 9. Execution of the sequences of instructions causes the computer system to support system design as will be described hereafter. In alternate embodiments, hardwire circuitry may be used in place of or in combination with software instructions to implement the present invention. Thus, the present invention is not limited to any specific combination of hardware circuitry and software. The system designer 900 includes a designer manager 910. The designer manager 910 receives a design for a system. The design may be described at a gate level or in a more abstract level. The design may be described in terms of an HDL such as VHDL or Verilog. The target device may be an ASIC, structured ASIC, FPGA, PLD, or other target device. The designer manager 910 is connected to and transmits data between the components of the system designer 900.

Block 920 represents a synthesis unit that performs synthesis. The synthesis unit 920 generates a logic design of a system to be implemented in the target device. According to an embodiment of the system designer 900, the synthesis unit 920 takes a conceptual HDL design definition and generates an optimized logical representation of the system. The optimized logical representation of the system generated by the synthesis unit 920 may include a representation that has a minimized number of functional blocks and registers, such as logic gates and logic elements, required for the system. Alternatively, the optimized logical representation of the system generated by the synthesis unit 920 may include a representation that has a reduced depth of logic and that generates a lower signal propagation delay.

Block 930 represents a technology mapping unit that performs technology mapping. The technology mapping unit 930 determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system. In an embodiment where the target device is an ASIC, the components could be gates or standard cells. In an embodiment where the target device is a structured ASIC, the technology-mapped netlist may contain components that can be implemented in the structured ASIC fabric, such as RAM blocks, multiplier blocks, and gates from a library of gates.

Block 940 represents a placement unit that performs placement. The placement unit 940 places the system on to the target device by determining which components or areas on the target device are to be used for specific functional blocks and registers. According to an embodiment of the system designer 900, the placement unit 940 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 940 may utilize a cost function in order to determine a good assignment of resources on the target device.

Block 950 represents a routing unit that performs routing. The routing unit 950 determines the routing resources on the target device to use to provide interconnection between the components implementing functional blocks and registers of the logic design.

Block 960 represents a physical synthesis unit that performs physical synthesis. The physical synthesis unit 960 may perform physical synthesis immediately after design entry and prior to synthesis, immediately after technology mapping and prior to placement, immediately after placement and prior to routing, immediately after routing, and/or during other times. According to an embodiment of the present invention, physical synthesis includes a series of circuit transformations to optimize the circuit for a given goal. The circuit transformations occur outside the stage of design entry, synthesis, technology mapping, placement, and routing. Physical synthesis may be used to optimize a circuit for goals such as reducing a delay of a signal transmitted on a circuit, reduction of an area required for implementing the circuit on a target device, reducing the amount of power required for operating the circuit or the system, improving the routability of the circuit, and/or other goals as described with reference to FIG. 1.

The physical synthesis unit 960 includes an estimation unit 961. The estimation unit 961 predicts and estimates characteristics of a circuit. The characteristics may include delay, area, power, and/or wirelength. The estimation unit 961 may perform the procedures described with reference to 301 in FIG. 3.

The physical synthesis unit 960 includes a cost analysis unit 962. The cost analysis unit 962 uses a cost function that maps a function G( ) for each path in the circuit that takes the circuit characteristics predicted by the estimation unit 961 and transforms these estimated values into a normalized criticality value that ranges from [0,1], according to constraints and priorities specified by the designer. The cost analysis unit 962 may perform the procedures described with reference to 302 in FIG. 3.

The physical synthesis unit 960 includes an optimization unit 963. The optimization unit 963 may utilize circuit transformation techniques such as incremental retiming, combinational or binary decision diagram (BDD)-based resynthesis, logic replication, and local rewiring to achieve the goal of reducing the area required for a circuit, reduce the delay of a signal, reduce the power required for a system, improve routability, and/or other goals. The optimization unit 963 may perform the procedures described with reference to 303 in FIG. 3.

The physical synthesis unit 960 includes a legalization unit 964. The legalization unit 964 may perform one or more procedures to legalize the system if the optimization unit 963 has created invalidated placement or routing of the system. The procedures performed by the legalization unit 964 include rotation, decomposition, and inversion to re-implement components on the target device, incremental placement to integrate the modifications made by timing driven optimizations into existing placement while perturbing the existing placement as little as possible, incremental re-routing to determine valid routes for the modified circuit, and/or other techniques. The legalization unit 964 may perform the procedures described with reference to 304 in FIG. 4.

According to an embodiment of the system designer 900, the design manager 910 performs an assembly procedure that creates a data file that includes the design of the system generated by the system designer 900. The data file may be a bit stream that may be used to program the target device. The design manager 910 may output the data file so that the data file may be stored or alternatively transmitted to a separate machine used to further process the design for the system or to program the target device. It should be appreciated that the design manager 910 may also output the design of the system in other forms such as on a display device or other medium.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A non-transitory computer readable storage medium including a sequence of instructions stored thereon for causing a computer to execute a method comprising:
synthesizing a system;
mapping the system onto programmable resources on a target device;
placing the system on the target device;
routing the system; and
performing physical synthesis on the system subsequent to the mapping procedure and prior to the placing procedure.

2. The non-transitory computer readable medium of claim 1, wherein performing physical synthesis comprises performing circuit transformations on a circuit in the system to optimize the system.

3. The non-transitory computer readable medium of claim 1, wherein performing physical synthesis comprises performing circuit transformations on a circuit in the system to optimize paths of the system to satisfy timing constraints.

4. The non-transitory computer readable medium of claim 1, wherein performing physical synthesis comprises performing circuit transformations on a circuit in the system to reduce an area required for implementing the circuit.

5. The non-transitory computer readable medium of claim 1, wherein performing physical synthesis comprises performing circuit transformation on a circuit in the system to reduce power consumption of the system.

6. The non-transitory computer readable medium of claim 1, wherein performing physical synthesis comprises performing circuit transformation on a circuit in the system to improve routability of the system.

7. The non-transitory computer readable medium of claim 1, wherein performing physical synthesis comprises:
performing circuit transformations on a circuit in the system to optimize the system; and
legalizing the circuit transformations.

8. The non-transitory computer readable medium of claim 7, wherein legalizing the circuit transformations comprises performing incremental placement and incremental routing of the system.

9. The non-transitory computer readable medium of claim 1, further comprising performing another physical synthesis on the system after the routing procedure.

10. The non-transitory computer readable medium of claim 9, wherein performing another physical synthesis comprises performing circuit transformations on a circuit in the system to optimize the system.

11. The non-transitory computer readable medium of claim 9, wherein performing another physical synthesis comprises performing circuit transformations on a circuit in the system to optimize paths of the system to satisfy timing constraints.

12. The non-transitory computer readable medium of claim 9, wherein performing another physical synthesis comprises performing circuit transformations on a circuit in the system to reduce an area required for implementing the circuit.

13. The non-transitory computer readable medium of claim 9, wherein performing another physical synthesis comprises performing circuit transformation on a circuit in the system to reduce power consumption of the system.

14. The non-transitory computer readable medium of claim 9, wherein performing another physical synthesis comprises performing circuit transformation on a circuit in the system to improve routability of the system.

15. The non-transitory computer readable medium of claim 9, wherein performing another physical synthesis comprises:
performing circuit transformations on a circuit in the system to optimize the system; and
legalizing the circuit transformations.

16. The non-transitory computer readable medium of claim 15, wherein legalizing the circuit transformations comprises performing one of rotation, decomposition and inversion to re-implement a look-up-table.

17. The non-transitory computer readable medium of claim 15, wherein legalizing the circuit transformation comprises performing incremental routing of the system.

18. The non-transitory computer readable medium of claim 1, further comprising outputting a design of the system to a machine to program the target device.

19. The non-transitory computer readable medium of claim 1, wherein physical synthesis performed after a first procedure leaves state information for a physical synthesis performed after a second procedure.

20. The non-transitory computer readable medium of claim 19, wherein the state information causes the physical synthesis performed after the second procedure to change.

21. The non-transitory computer readable medium of claim 1, further comprising performing another physical synthesis on the system subsequent to the mapping procedure and prior to the placing procedure.

22. A non-transitory computer readable storage medium including a sequence of instructions stored thereon for causing a computer to execute a method comprising:
synthesizing a system;
mapping the system onto programmable resources on a target device;
placing the system on the target device;
routing the system; and
performing physical synthesis on the system prior to the routing and performing physical synthesis on the system after routing the system.

23. The non-transitory computer readable medium of claim 22, wherein performing physical synthesis comprises performing circuit transformations on a circuit in the system to optimize the system.

24. The non-transitory computer readable medium of claim 22, wherein performing physical synthesis comprises performing circuit transformations on a circuit in the system to optimize paths of the system to satisfy timing constraints.

25. The non-transitory computer readable medium of claim 22, wherein performing physical synthesis comprises performing circuit transformations on a circuit in the system to reduce an area required for implementing the circuit.

26. The non-transitory computer readable medium of claim 22, wherein performing physical synthesis comprises performing circuit transformation on a circuit in the system to reduce power consumption of the system.

27. The non-transitory computer readable medium of claim 22, wherein performing physical synthesis comprises performing circuit transformation on a circuit in the system to improve routability of the system.

28. The non-transitory computer readable medium of claim 22, wherein performing physical synthesis comprises:
  performing circuit transformations on a circuit in the system to optimize the system; and
  legalizing the circuit transformations.

29. The non-transitory computer readable medium of claim 28, wherein legalizing the circuit transformations comprises performing incremental routing of the system.

30. A method for designing a system on a target device, the method comprising:
  synthesizing a system;
  mapping the system onto programmable resources on the target device;
  placing the system on the target device;
  routing the system; and
  performing physical synthesis on the system subsequent to the mapping procedure and prior to the placing procedure, wherein one of the synthesizing, mapping, placing, routing, and physical synthesis procedures are performed by a processor.

31. The method of claim 30, wherein performing physical synthesis comprises performing circuit transformations on a circuit in the system to optimize the system.

32. The method of claim 30, further comprising performing another physical synthesis on the system subsequent to the routing procedure.

* * * * *